United States Patent
Baukus et al.

(10) Patent No.: US 6,924,552 B2
(45) Date of Patent: Aug. 2, 2005

(54) MULTILAYERED INTEGRATED CIRCUIT WITH EXTRANEOUS CONDUCTIVE TRACES

(75) Inventors: James P. Baukus, Westlake Village, CA (US); Lap-Wai Chow, South Pasadena, CA (US); William M. Clark, Jr., Camarillo, CA (US); Paul Ou Yang, San Jose, CA (US)

(73) Assignees: HRL Laboratories, LLC, Malibu, CA (US); Promtek, Santa Clara, CA (US)

(*) Notice: Subject to any disclaimer, the term of this patent is extended or adjusted under 35 U.S.C. 154(b) by 0 days.

(21) Appl. No.: 10/686,545

(22) Filed: Oct. 14, 2003

(65) Prior Publication Data

US 2004/0119165 A1 Jun. 24, 2004

Related U.S. Application Data

(60) Provisional application No. 60/420,173, filed on Oct. 21, 2002.

(51) Int. Cl.[7] .............................................. H01L 23/04
(52) U.S. Cl. ..................... 257/698; 257/700; 257/774; 438/622
(58) Field of Search ................................ 257/698, 700, 257/774; 438/622

(56) References Cited

U.S. PATENT DOCUMENTS

| 5,783,846 | A |  | 7/1998 | Baukus et al. ............... 257/204 |
| 5,866,933 | A |  | 2/1999 | Baukus et al. ............... 257/368 |
| 5,973,375 | A |  | 10/1999 | Baukus et al. ............... 257/399 |
| 6,117,762 | A |  | 9/2000 | Baukus et al. ............... 438/618 |
| 6,207,479 | B1 |  | 3/2001 | Liew et al. .................. 438/129 |
| 6,413,847 | B1 | * | 7/2002 | Yeh et al. .................... 438/598 |
| 6,528,885 | B2 | * | 3/2003 | Vajana et al. ............... 257/758 |
| 2002/0024148 | A1 |  | 2/2002 | Itoh ........................... 257/784 |
| 2002/0079564 | A1 | * | 6/2002 | Vajana et al. ............... 257/679 |

FOREIGN PATENT DOCUMENTS

| EP | 1 193 758 A1 | 4/2002 |
| JP | 2001-284357 | 10/2001 |
| WO | 02/43147 A1 | 5/2002 |

OTHER PUBLICATIONS

Rovedo. Nivo, et al., "Introducing IBM'S First Cooper Wiring Foundry Technology: Design, Development, and Qualification of CMOS 7SF, a 18–μm Dual–Oxide Technology for SRAM, ASICs, and Embedded DRAM," *MicroNews*, Fourth Quarter 2000, vol 6, No. 4, INTERNET: <http://www–3.ibm.com/chips/micronews/vol16_no4/rovedo.html> 7 pages (Feb. 15, 2002).

Sze, S.M., *VSLI Technology*, McGraw–Hill, pp. 99, 447, 461–465 (1983).

* cited by examiner

*Primary Examiner*—Luan Thai
(74) *Attorney, Agent, or Firm*—Ladas & Parry LLP

(57) ABSTRACT

A multilayered integrated circuit and a method of designing a multilayered integrated circuit are provided. The circuit comprises at least two conductive layers and extraneous conductive lines placed in the conductive layers. The extraneous conductive lines are made of a material which is the same as the material in the conductive layers and have dimensions which are the same as the dimension of the material in the conductive layers. The extraneous conductive lines perform functions which are unnecessary to the operation of the integrated circuit and are undistinguishable from the functional conductive lines, thus burdening the work of a reverse engineer. The method of designing the multilayered circuit comprises a step of providing a computer generated representation of the extraneous conductive lines.

48 Claims, 11 Drawing Sheets

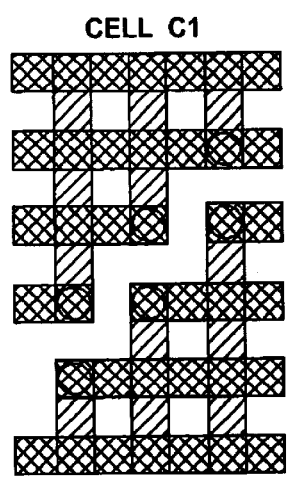 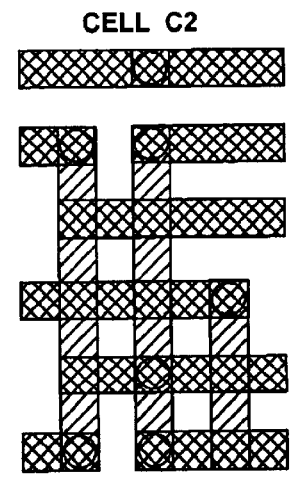 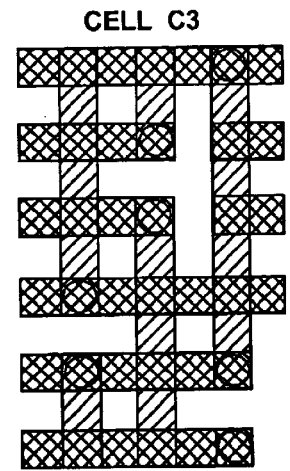
FIG. 14A  FIG. 14B  FIG. 14C
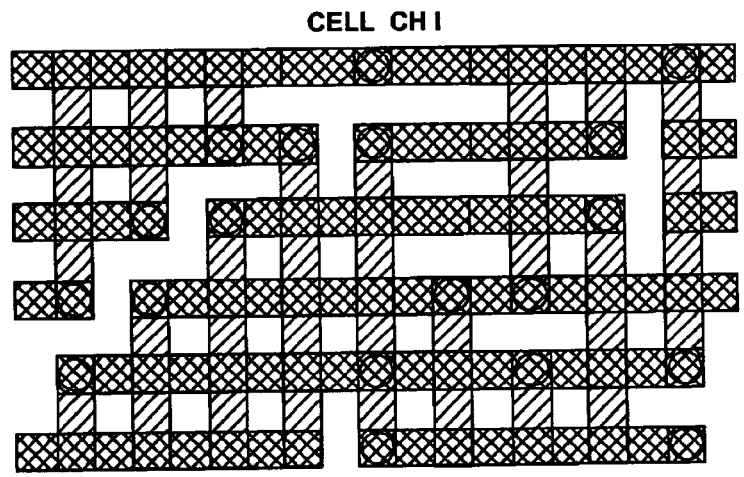
FIG. 15

MULTILAYERED INTEGRATED CIRCUIT WITH EXTRANEOUS CONDUCTIVE TRACES

CLAIM OF BENEFIT OF PROVISIONAL APPLICATION

This application claims the benefit of U.S. provisional application Ser. No. 60/420,173 filed on Oct. 21, 2002, which is incorporated herein by reference in its entirety.

BACKGROUND

1. Field

The present disclosure relates to the prevention and/or inhibition of reverse engineering of digital integrated circuits. More particularly, it relates to a multilayered integrated circuit comprising extraneous conductive traces or lines to confuse the reverse engineer, to a process of making a multilayered integrated circuit comprising a step of forming extraneous conductive traces or lines and to a method of designing a multilayered electronic circuit.

2. Description of the Related Art

Modern integrated circuits are constructed such that the signal is routed via metallic lines between blocks such as circuit blocks, logic blocks or memory blocks, or sometimes between transistors within a single block, and to I/O ports. For purposes of compaction, more than one metal layer is used, the two or more layers being separated, for example, by deposited oxide or low-k dielectric materials. These metal lines often comprise a cross-hatched appearance when viewed from the top of the circuit.

FIG. 1 shows a prior art connection between metal traces on different layers. Metal traces 1 and 2 are located on an upper or first layer, while metal trace 3 is located on a lower or second layer. An electrical path between trace 1 and trace 2 is formed by means of conductive via holes 4, 5 filled with metal. The via holes 4, 5 are located within an intermediate layer between the upper layer and the lower layer. The intermediate layer comprising the via holes 4, 5 is usually made of oxide or low-k dielectric material and is typically 1 micrometer thick. The upper, intermediate, and lower layers are not shown in the figure, for clarity purposes.

FIG. 2 shows a schematic plan view of the prior art shown in FIG. 1.

Typically, lines formed from a particular metal layer are routed in parallel along so-called routing or wiring channels. Usually, the routing channels are not filled. Integrated circuits can have a variable number of metal layers, there is no fixed number for all cases.

The design, development and manufacturing efforts pertaining to semiconductor integrated circuits involve the understanding of complex structures, processes and manufacturing techniques involving smaller and smaller electronic circuitry. Efforts to achieve such understanding and establish successful design, development and production manufacturing of such integrated circuits involve many man-hours of highly skilled professionals and considerable expense.

On the other hand, to avoid costly man-hours and other significant expenses some developers resort to reverse engineering practices wherein existing devices are taken apart, probed and otherwise examined to determine the physical structures of the resultant integrated circuit for subsequent copying. This reverse engineering, which typically relies primarily on obtaining a planar optical image of the circuit and, in essence, attempts to by-pass typical product development efforts and expenses by studying and copying a competitive product.

Various approaches can be utilized to prevent reverse engineering of semiconductor integrated circuits. For example, some of the inventors of the present invention have developed concepts taught in U.S. Pat. Nos. 5,866,933, 5,783,846, 5,973,375, and 6,117,762 in which normal metal connections between transistor active areas and contacts are buried in the semiconductor substrate.

These hidden interconnections are typically utilized to replace a good portion of the metal interconnections that would occur in the metal layer nearest the substrate. The use of these hidden interconnectors significantly complicates the reverse engineering because visual inspection of the metal patterns no longer suffices, so that etching and carefully recording each layer down to the substrate is required. Moreover, resolution to within the process-minimum feature size is required of etchant stains that are selective to delineate n- versus p- implants.

The composite of these techniques means that the reverse engineer must provide careful analysis of each transistor and its connections, a process that involves literally millions of steps for even a moderately complex integrated circuit. If this indeed becomes necessary for the reverse engineer, then the task is time consuming and costly. As a result the reverse engineer tries to find ways to automate the process, finding replicated patterns of tricks which are then loaded into a database that identifies, catalogues and places the appearances of similar circuit blocks throughout the circuit.

SUMMARY OF THE INVENTION

The present invention seeks to thwart all such automation techniques. This is accomplished by filling up the interconnection conductive layer routing channels with what appear to be legitimate wiring traces, that appear at static voltages or even clocked voltages, but which are not in any way connected to the operational functionality of the circuit. The placement of these extraneous conductive traces is quasi random, not repeatable within similar circuit blocks, and therefore forces the reverse engineer to abandon the automation protocols, and hopefully abandon the entire reverse engineering activity as well.

According to a first aspect, a multilayered integrated circuit is provided, comprising: an upper conductive layer having upper conductive lines for carrying electrical signals among components of the integrated circuit; a lower conductive layer having lower conductive lines for carrying electrical signals among components of the integrated circuit; and an intermediate layer having conductive via holes electrically connecting the upper conductive lines with the lower conductive lines, wherein at least one line among the upper conductive lines and lower conductive lines is an extraneous conductive line; the at least one extraneous conductive line is made of a material which is the same as the material of the upper and lower conductive lines; and the at least one extraneous conductive line performs functions which are unnecessary to the operation of the integrated circuit.

According to a second aspect, a process of making a multilayered integrated circuit is provided, the process comprising the steps of: forming an upper conductive layer having upper conductive lines for carrying electrical signals among components of the integrated circuit; forming a lower conductive layer having lower conductive lines for carrying electrical signals among components of the integrated circuit; forming an intermediate layer having via holes electrically connecting the upper conductive lines with the lower conductive lines; forming extraneous conductive lines in at least one conductive layer among the upper conductive layer and lower conductive layer, the extraneous conductive lines being made of a material which is the same of the material of the upper and lower conductive lines, the extraneous conductive lines performing functions which are unnecessary to the operation of the integrated circuit.

According to a third aspect, a method of designing a multilayered electronic circuit comprising functional conductive lines for transmission of electric signals and extraneous conductive lines is provided, the designed multilayered circuit being suitable for making a corresponding three-dimensional multilayered electronic circuit, the method comprising: providing a representation of a first conductive layer having first layer functional conductive lines for carrying electrical signals among components of the electronic circuit; providing a representation of a second conductive layer having second layer functional conductive lines for carrying electrical signals among components of the electronic circuit; providing a representation of functional via holes electrically connecting the first layer conductive lines with the second layer conductive lines; and providing a representation of extraneous conductive lines to be inserted in at least one layer among the first conductive layer and the second conductive layer.

According to a fourth aspect, a process of making an electronic circuit is provided, the process comprising the steps of: providing functional conductive lines for carrying electrical signals among components of the electronic circuit; providing functional via holes for electrical connection of the functional conductive lines; providing extraneous conductive lines, the extraneous conductive lines performing functions which are unnecessary to the operation of the electronic circuit; and providing extraneous via holes for electrical connection of the extraneous conductive lines.

In the present invention, extraneous conductive lines or traces are provided in the routing channels to confuse a reverse engineer. The extraneous conductive lines may begin or end on a given transistor active area. However, they either do not lead anywhere or do not perform any necessary function to the operation of the integrated circuit. The extraneous conductive lines appear to be real connections between transistors, active areas, supplies etc. but in fact are not. Alternatively, if the lines are "active" with a signal, then that signal is specious in that it is not part of nor does it contribute to the fundamental functionality of the circuit. For example, the extraneous lines could be allowed to float, without being tied to any portion of the circuit. Alternatively, the extraneous lines could be tied to ground or to power supply or to a transistor whose voltage varies as per some functional part of the circuit.

Present advanced CMOS processes (about 0.25 $\mu$m minimum feature size and less) utilize chemical mechanical polishing (CMP) to planarize circuit layers. During these processes, integrated circuit manufacturers also fill up the wiring channels with random bits of metal so that the etching/polishing step above a given metal layer ends on a solid metal 'front.' However, the metal fill in the wiring channels is typically in the form of small rectangular shapes. No attention is given to making the random metal portions look like normal conducting metal traces with vias so as to throw off the reverse engineer.

The present invention can be applied to a vast range of integrated circuits, comprising for example CMOS pairs, or bipolar circuits or circuits made with III–V materials.

Upon the teachings of the present invention, the person skilled in the art will recognize that extraneous conductive lines in the routing channels complicate the task for the reverse engineer. In some cases the extraneous lines could be connected at one point to an active area so that the line is held at a constant voltage when the circuit is activated. In other cases the lines might just float with no point connected to an active area or voltage. Additionally, the extraneous conductive lines could connect transistors and carry a specious signal so as to confuse the reverse engineer and force detailed analysis of a totally unnecessary portion of the integrated circuit. The extraneous conductive traces according to the present invention look like regular conductive traces connecting one layer to the other through the use of vias, so that the reverse engineer must trace the line and determine vias taking many steps to determine whether the metal line is functional or not. Preferably, most part or all of the remaining space in the routing channels is filled with extraneous conductive traces.

When the technique according to the present invention is used, circuit analysis via Voltage Contrast Scanning Electron Microscopy (VCSEM), and other techniques utilized to automatically determine circuit functionality, is made much more difficult.

BRIEF DESCRIPTION OF THE DRAWINGS

The present invention will be understood and appreciated more fully from the following detailed description taken in conjunction with the drawings in which:

FIGS. 14–18 show a series of steps of placing extraneous conductive traces and vias according to a second embodiment of the present invention.

DETAILED DESCRIPTION

Throughout the present specification, the terms 'trace' and 'line' are used interchangeably.

Figure 1:
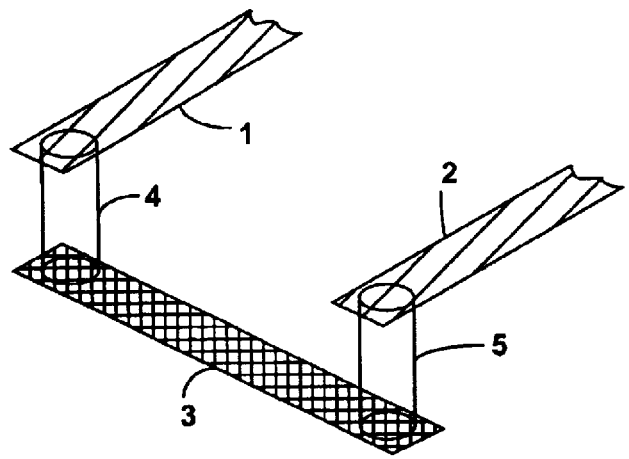
FIG. 1 is a schematic perspective view of a prior art arrangement of conductive traces and via hole in an integrated circuit having a multilayered structure.
Figure 3:
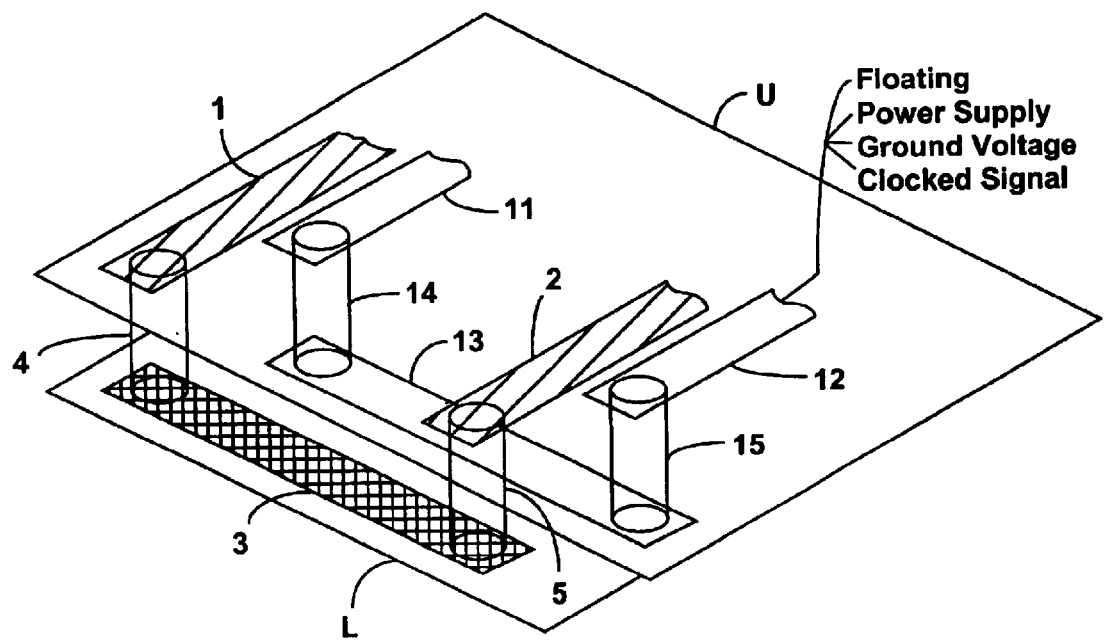
FIG. 3 is a schematic perspective view of a first embodiment according to the present invention.

FIG. 3 shows a first embodiment of the present invention, where functional conductive traces or lines 1 and 2 are shown on an upper or first layer, and functional conductive line 3 is shown on a lower or second layer. Additional extraneous conductive traces 11, 12 are located on the upper layer and an additional extraneous conductive trace 13 is created on the lower layer. The extraneous conductive traces of FIG. 3 are shaded differently from the functional conductive traces for clarity purposes only. In the real implementation of the embodiment shown in FIG. 3 the material and dimensions used for the extraneous traces are the same as the material and dimensions used for the real, functional traces. Traces 1, 2, 11, and 12 are located in an upper routing channel U. Traces 3 and 13 are located in a lower routing channel L. FIG. 3 also shows additional via holes 14, 15 located within an intermediate layer.

In the embodiment shown in FIG. 3, the path between trace 11 and trace 12 is an extraneous path, drafted with the intention of burdening the work of the reverse engineer. Therefore, the reverse engineer will believe that the path between trace 11 and trace 12 has an electrical purpose, given the presence of the traces 11, 12, and 13 and of the via holes 14 and 15. It is only by carefully tracing the conductive lines, and determining that they do not participate in the function of the circuit, that the reverse engineer would be shown the error. Should this be the case, the reverse engineer will be partially helped if the extraneous conductive lines float and are not connected to power supply or ground voltages.

However, a preferred embodiment of the present invention provides that any one of traces 11, 12 or 13, or a combination thereof makes contact with power supply or ground voltages, or an appropriately chosen clocked voltage, as shown in FIG. 3. By providing that the extraneous conductive lines or traces contact a power supply or ground voltage, the reverse engineer will be brought to believe that such extraneous lines are actually functional lines.

Figure 4:
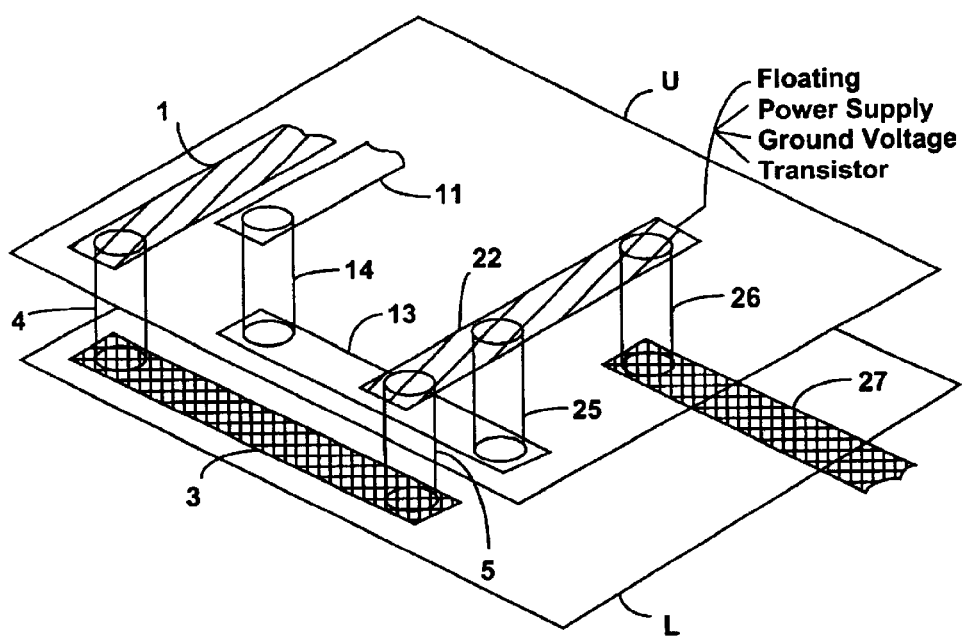
FIG. 4 is a schematic perspective view of a second embodiment according to the present invention.

FIG. 4 shows a second embodiment of the present invention, where a path comprising both functional conductive traces and extraneous conductive traces is formed. More specifically, FIG. 4 shows a first, functional, path comprising functional upper trace 1, via hole 4, functional lower trace 3, via hole 5, functional upper trace 22, via hole 26 and functional lower trace 27. The terms upper and lower indicate whether the trace is located on the upper or lower layer, respectively. Additionally, FIG. 4 shows a second, extraneous, path comprising extraneous upper trace 11, via hole 14, extraneous lower trace 13, via hole 25, functional upper trace 22, via hole 26 and functional lower trace 27. Traces 1, 11, and 22 are located in an upper routing channel U. Traces 3, 13, and 27 are located in a lower routing channel L.

The connection of the extraneous path in FIG. 4 comprised of segments 11-14-13-25 could be at any of several voltage values depending on the nature of line 22. Line 22 could be connected to ground or a power supply voltage, which would then define the same voltage as that resident on the extraneous path.

Should this be the case, the person skilled in the art shall recognize various methods to insure that the extraneous path does not load the functioning circuit in a way that compromises performance. For example, parasitic loading of the added extraneous path will modify circuit speed and power consumption to various degrees, but typically less than 10%.

The person skilled in the art will readily implement embodiments which are similar to those indicated in FIG. 3 and FIG. 4. For example, extraneous traces could be provided on the upper layer only, on the lower layer only or on both layers. Additionally, in accordance with the teachings of the previous paragraph, the person skilled in the art will understand how an extraneous path can be connected to any of several voltages in the circuit.

The person skilled in the art will also understand that the embodiments shown in FIGS. 3 and 4 can also apply to layered structures having more than two layers. For example, extraneous paths could be created along three or more layers.

Figure 2:
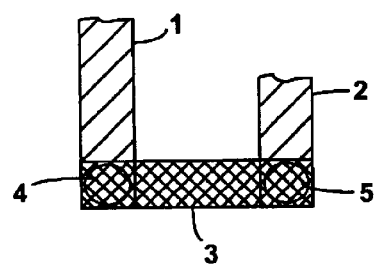
FIG. 2 is a top plan view of the arrangement of FIG. 1.
Figure 5:
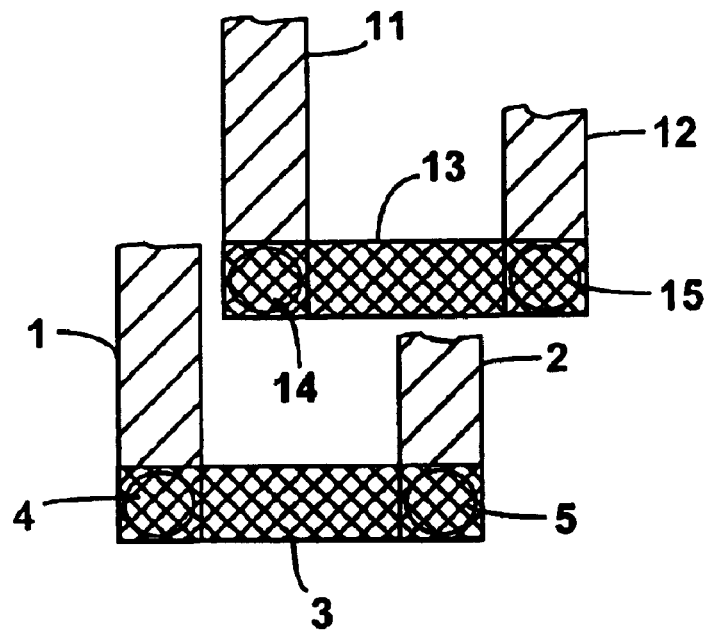
FIG. 5 is a top plan view of the embodiment of FIG. 3.
Figure 6:
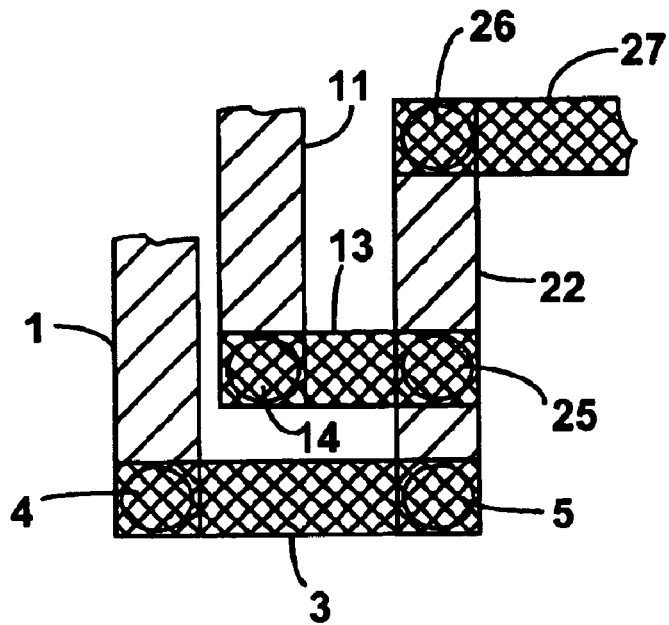
FIG. 6 is a top plan view of the embodiment of FIG. 4.

FIGS. 5 and 6 show schematic plan views of embodiments shown in FIGS. 3 and 4, respectively. With reference to FIGS. 5 and 6, no pictorial distinction between functional traces and extraneous traces has been represented. It is easy to note that it will be very difficult for the reverse engineer to understand that circuits like those shown in FIGS. 5 and 6 are electrically equivalent to a circuit like the one shown in FIG. 2. This is especially true when the extraneous paths are tied to voltages in the circuits, as already explained above.

The metal filling steps for integrated circuits are usually taken after the circuit is laid out. As such the circuit design must fit into the vendor's CAD program. Implementation of the above described anti-reverse engineering circuit and process can be done by manual insertion of the additional lines by the designer within the CAD package. However, this approach is not recommended because of the extremely large number of transistors and wiring channels in a modern integrated circuit. As a consequence, the implementation is preferably accomplished by a software routine in the CAD software which adds conductive lines or traces in a metal layer. As already explained above, the traces could be tied to a voltage or be allowed to float.

Usually, functional traces and vias are placed and connected by means of an automatic computer controlled "Place and Route" process.

Figure 7:
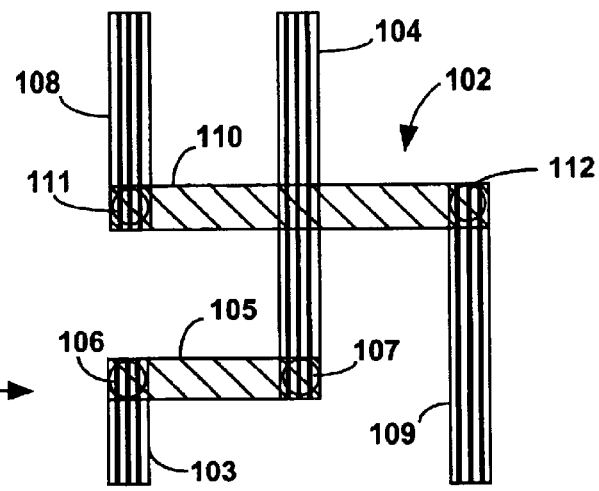
FIG. 7 is a top plan view of a portion of connecting elements placed along two layers of a circuit.
Figure 10:
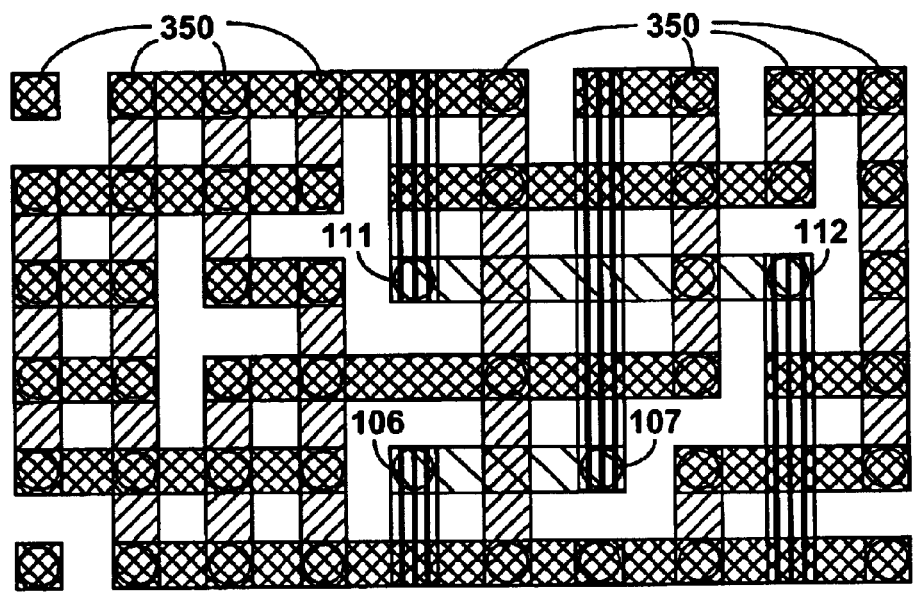

FIG. 7 shows two such typical connectors, connector 101 and connector 102. Connector 101 comprises traces 103, 104 placed on a first level and trace 105 placed on a second level. Trace 103 is connected to trace 105 through via hole 106, and trace 105 is connected to trace 104 through via hole 107. Connector 102 comprises traces 108, 109 placed on the first level and trace 110 placed on the second level. Trace 108 is connected to trace 110 through via hole 111, and trace 110 is connected to trace 109 through via hole 112. For the purpose of convenience, FIG. 7 has been shown with only two layers of metal and one type of via. Modern Application Specific Integrated Circuit (ASIC) CAD technology can support up to as much as nine layers of metals and eight sets of vias connecting these nine conductive layers. However, the concepts of the present invention can be easily applied to any number of layers. Usually, a certain conductive layer is preferred in the place-and-route program to route the connection in one direction, either horizontally or vertically. In FIG. 10, to be later described in more detail, for example, the upper layer is routing in the vertical direction, and the lower layer is routing in the horizontal direction.

According to a first embodiment, the Place-and-Route routine comprises four steps: 1) Metal fill up; 2) Random percentage cut of metal layers; 3) Addition of extraneous vias; and 4) Deletion of some unwanted vias which are not at either ends of either metals.

Step One: Metal Fill Up

Empty space is first filled with strips of metal within the layers, wherein the filling operation is generated by a computer program. The direction of the computer generated extraneous conductive strips follows the directional preference of each particular conductive layer as defined in the place-and-route process. The extraneous conductive strips have preferably the same width as the routing metals. They are separated from each other and also from the routing metals of the same layer by a distance specified in the process design rules.

Figure 8:
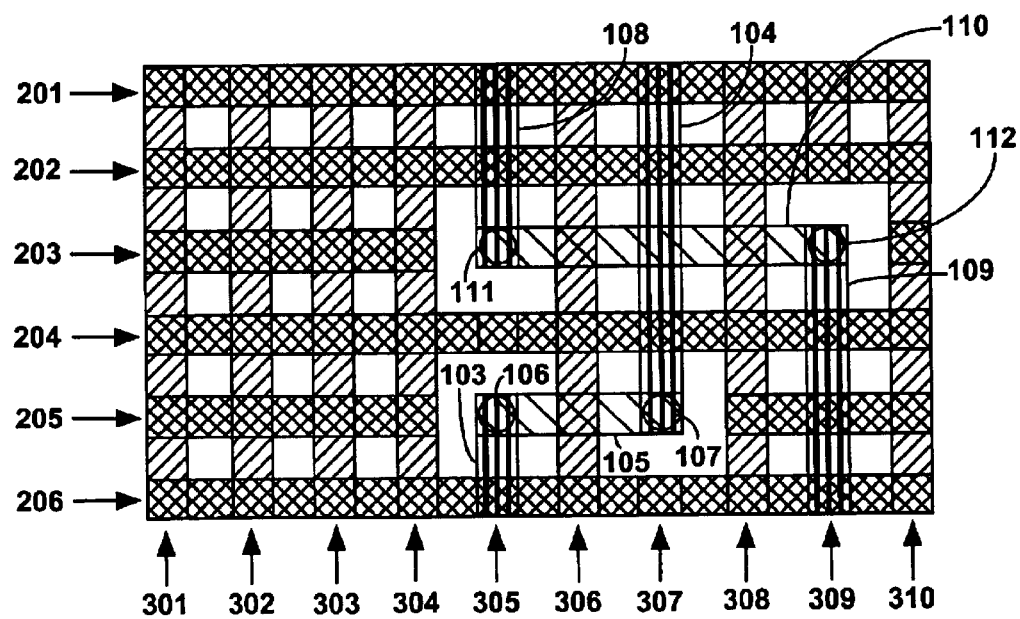
FIGS. 8–12 show a series of steps of placing extraneous conductive traces and vias according to a first embodiment of the present invention.

FIG. 8 shows the result of this first step, where the structure providing connector 101 (i.e. 103-106-105-107-104) and connector 102 (i.e. 108-111-110-112-109) now comprises, in addition, horizontal strips of metal 201–206 in the first layer and vertical strips 301–310 of metal in the second layer. Those additional layers fill up the space without original routing in the first and second layers.

Step Two: Random Percentage Cut of Conductive Layers

A second software routine detects the length of each conductive trace in terms of grid size. A grid is an imaginary line lying exactly at the center of conductive traces. Grid size is the unique distance from center to center of two neighboring conductive connectors specified by the design rule of the technology. All the functional and extraneous metals should preferably have the same grid size (width plus separation). Therefore, the present step burdens the work of the reverse engineer when he tries to individuate different patterns in the circuit.

After detection of their length, the extraneous conductive traces introduced in the previous step are cut randomly into different lengths in terms of grid size. The randomness is created by a pseudo random generator subroutine in the program. As the result of this random cutting, a conductive strip can be 100% intact without any cutting, or cut into two pieces with, for example, 30% and 70% of the original length, or even more pieces, each having a different percentage of the total length. For example, if random numbers in the range 1 to 10 are generated, and a first number to be generated is 4, 40% of the original length will be cut. A successive random number is then generated, and if this number is 7, 70% of the remaining length will be cut, and so on, up to a predetermined level of random generated numbers.

Figure 9:
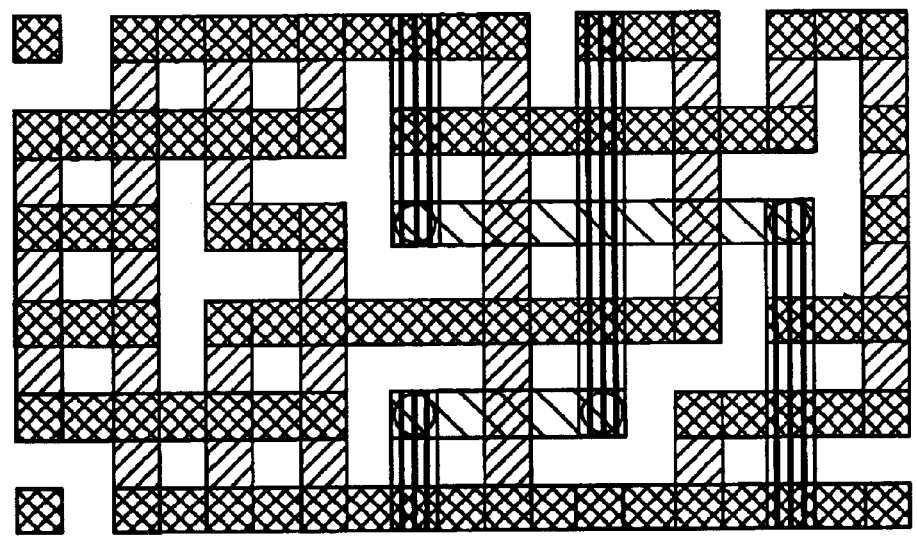

FIG. 9 shows the pattern of the extraneous and functional conductive traces after the random percentage cut.

Step Three: Adding of Extraneous Vias

A third software routine generates extraneous connecting vias 350, as shown in FIG. 10, with the same process steps that created the vias 106, 107, 111, and 112 of FIG. 7, at all locations where the upper layer and the lower layer overlap. Each via has a standard size defined by the design rule, due to fabrication process requirements.

FIG. 10 shows the pattern of the conductive traces and vias after the step of generating the additional vias.

Step Four: Deleting some Unwanted Vias which are not at either ends of either Metal Line In order to make the extraneous conductive traces and extraneous connecting vias look like real connectors, some of the extraneous connecting vias added in the previous step should be deleted. The reason behind this is that, in most cases, a functional, real connector has vias connecting the two conductive layers at the location where those metals ended, as shown in FIG. 7. In the previous step, vias were placed all over the overlapping areas of the two metals. A further software routine is used to delete part of these placed vias. The deleting decision is controlled by a user-specified percentage. As an example, if an 80% is specified, the program will keep the two vias at the end of the conductive trace, and delete 80% in number of the vias in between. The locations of the vias left are again randomly spread over the whole conductive trace.

Figure 11:
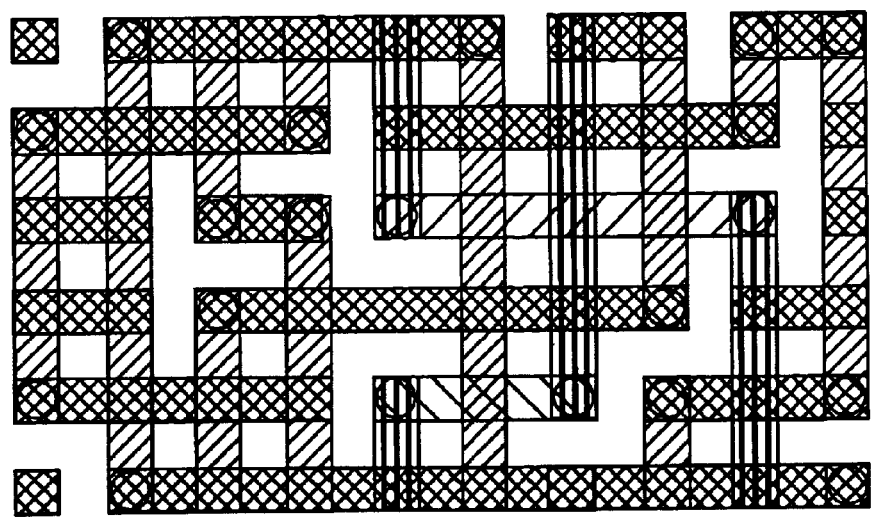

FIG. 11 shows the case that 100% of the filled vias between the two vias at an end of a conductive strip are deleted. Therefore, the vias left are only those at the end of a conductive strip.

Alternatively to steps three and four explained above, a single step of providing extraneous via holes at the ends of the extraneous conductive lines could be provided. In such step, also via holes not necessarily placed at the ends of the extraneous conductive lines could be provided, similarly to what is done by means of the deleting software routine of step four above.

Figure 12:
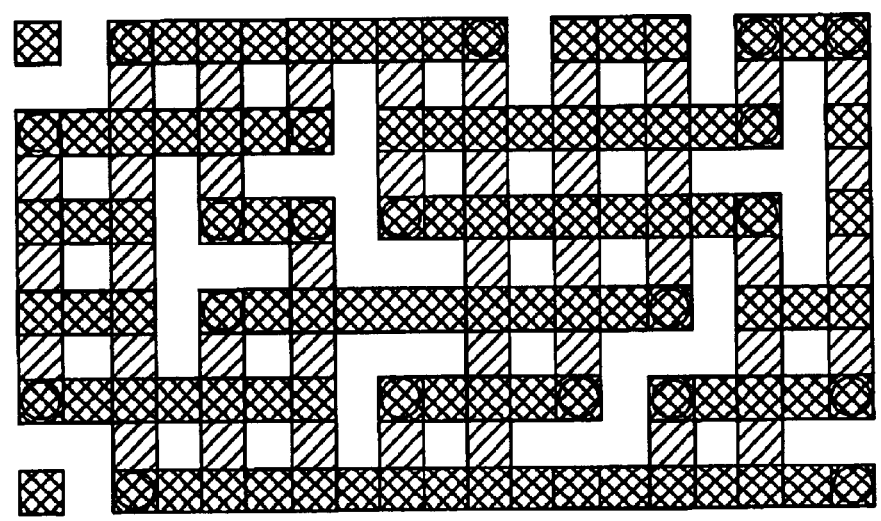

In all FIGS. 7–11, different patterns were used to differentiate the extraneous metal/via from the original metal/via and to differentiate between one level and another. In an actual ASIC, extraneous metal and original metal, extraneous via and original via are not optically differentiable on chip. This is shown in FIG. 12. From FIG. 12, it is clear that trying to figure out the functional connectors from the filled ones will be very difficult.

Figure 13:
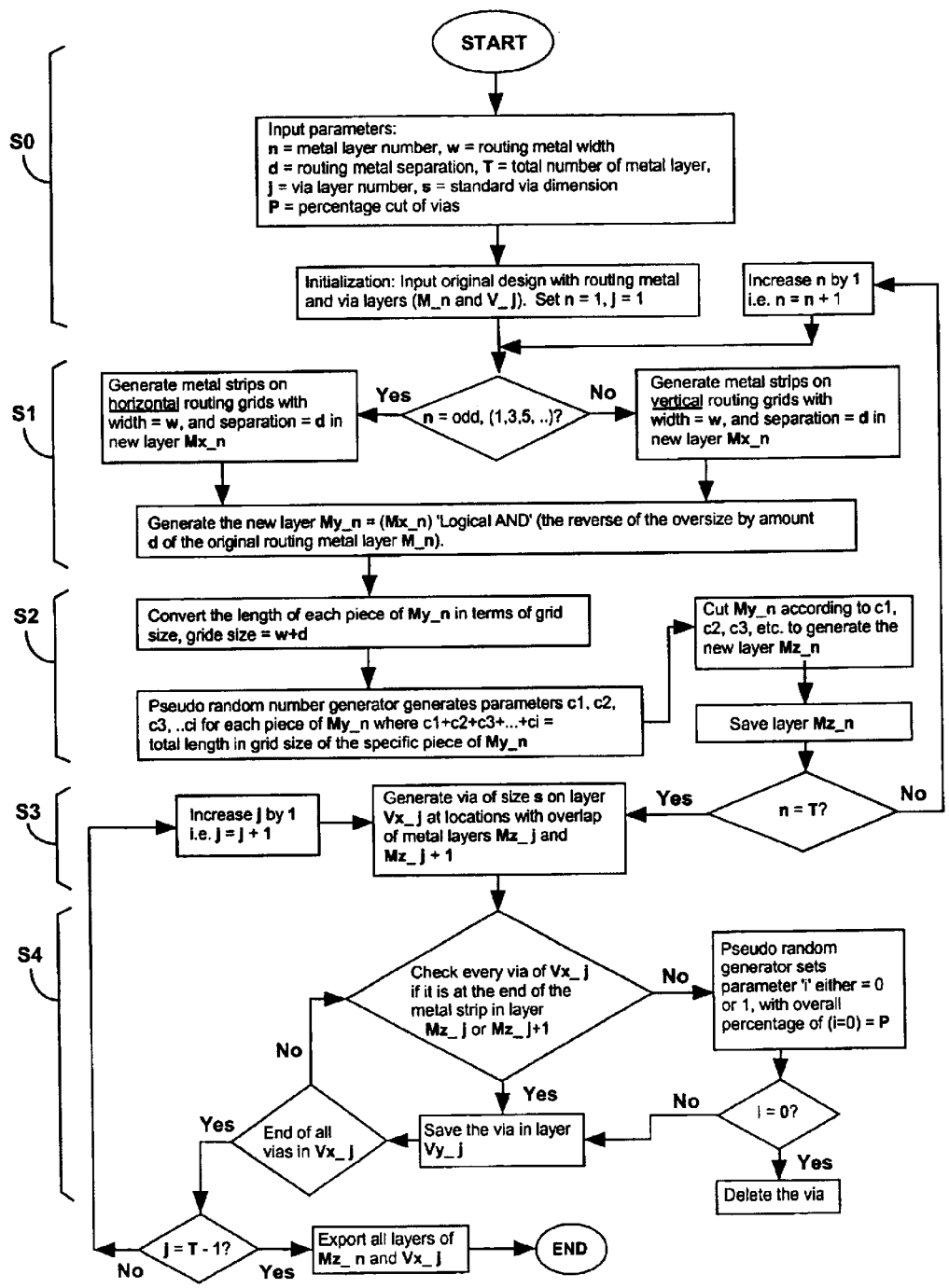
FIG. 13 shows a flow-chart diagram in accordance with the steps of FIGS. 8–12.

FIG. 13 shows a flow-chart diagram detailing the first embodiment, where S0 indicates initialization operations, S1 indicates operations relating to the first step, S2 indicates operations relating to the second step, S3 indicates operations relating to the third step, and S4 indicates operations relating to the fourth step.

According to a second embodiment, the Place-and-Route routine comprises the following four steps: 1) Designing basic fill cells; 2) Combining basic fill cells to form larger cells; 3) Deleting filled metals overlapping or too close to the original metals; and 4) Deleting filled vias without the correct layers of filled metal coverage. Such steps will now be explained in greater detail.

Step One: Designing Basic Fill Cells

The first step of the process is that of designing a number of different basic cells comprising extraneous metal traces and extraneous connecting vias. Since functional connectors, comprising functional conductive traces and connecting vias, generated in the Place-And-Route program possess certain characteristics, the best way to duplicate them is to manually design all kinds of similar routing structures in the extraneous metal layers and connecting vias. The number of these designated basic cells can be, for example, up to 30–50. FIGS. 14A–14C show three examples of these cells. The metal and via patterns in these cells are purposely designed in such a way to make them look like functional Place-And-Route connectors. Various and different shapes of cells can, of course, be used in connection with the present invention, the above three cells being only described for exemplary purposes. Any kind of cells could be designed, even cells having a single conductive line or a single via hole.

Step Two: Combining Basic Fill Cells to Form Larger Cells

In this step, the basic cells designed in the previous step are combined to form a next level of larger cells.

FIG. 15 shows an example of this second step, where cells C1, C2 and C3 of FIGS. 14A–14C are abutted together to form a next-level cell CH1. Assuming a total of 30 different basic cells at the lowest level, all combinations of abutting three cells together will give 2700 different higher level cells CH1 to CH2700. The extraneous metal traces and extraneous connecting vias in these higher level cells will undoubtedly look very similar to the functional routing traces and vias since they are copies of the basic cells. Again, combining several of the next level cells can produce even larger cells at another higher level. Continuing in this way, a large enough cell to cover a portion of the whole ASIC chip intended to have extraneous metals and vias will be obtained. In this final cell, all filled metals and vias have enough randomness due to the large number of combinations of cells, and at the same time, they will be very similar to functional routing connectors.

Figure 16:
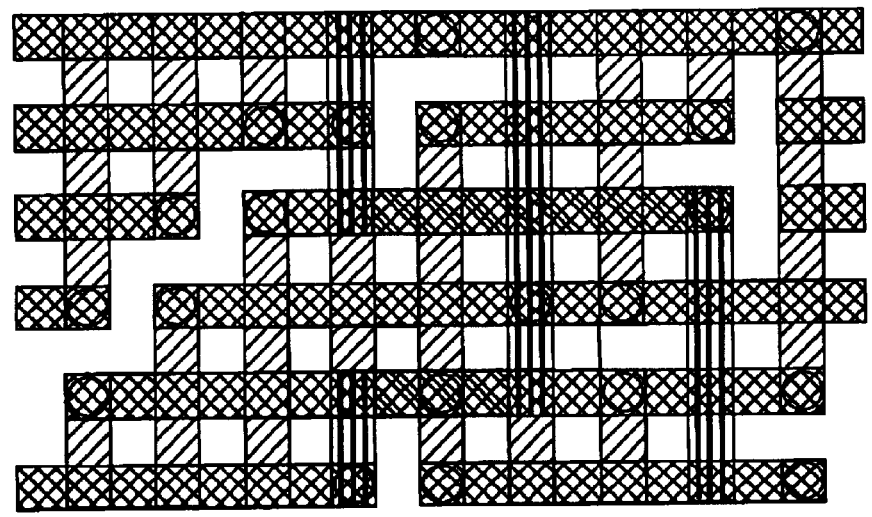

After creating the final cell, such cell can be placed and aligned on top of the ASIC area containing, for example, a structure identical to the structure shown in FIG. 7, thus forming the structure shown in FIG. 16.

Figure 17:
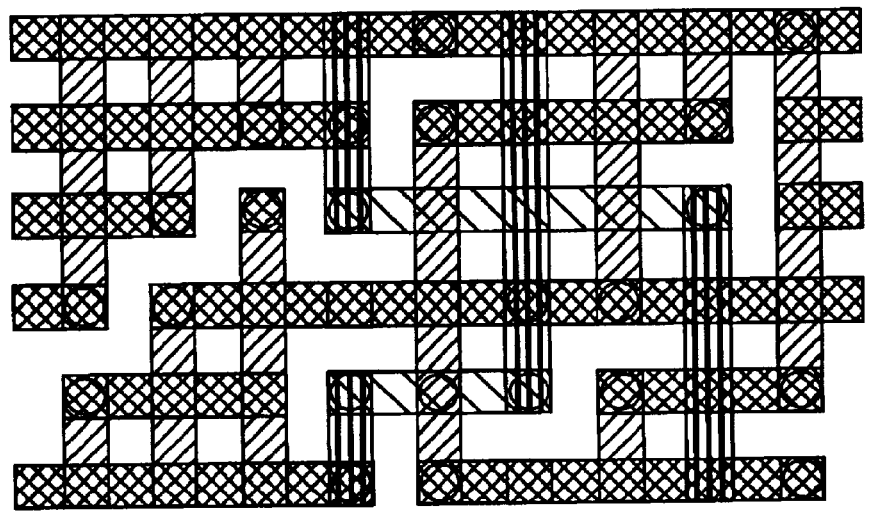

Step Three: Deleting Extraneous Metal Lines Overlapping or too Close to the Functional Conductive Lines A further software routine then deletes all the extraneous metals which are either overlapping or are too close to the functional metal lines, i.e. closer than the design rule allows. This is done to all the metal layers in the design. The result is shown in FIG. 17 where portions of the extraneous filled metal were deleted.

Step Four: Deleting Extraneous Vias without the Correct Layers of Filled Metal Coverage After cutting the part of the filled metals that either touch or are too close to the routing metals, another software routine will take care of those superfluous connecting vias having their covering metals deleted in the previous step. All superfluous vias without the covering of appropriate extraneous metal traces should be deleted in order to burden the work of the reverse engineer.

Figure 18:
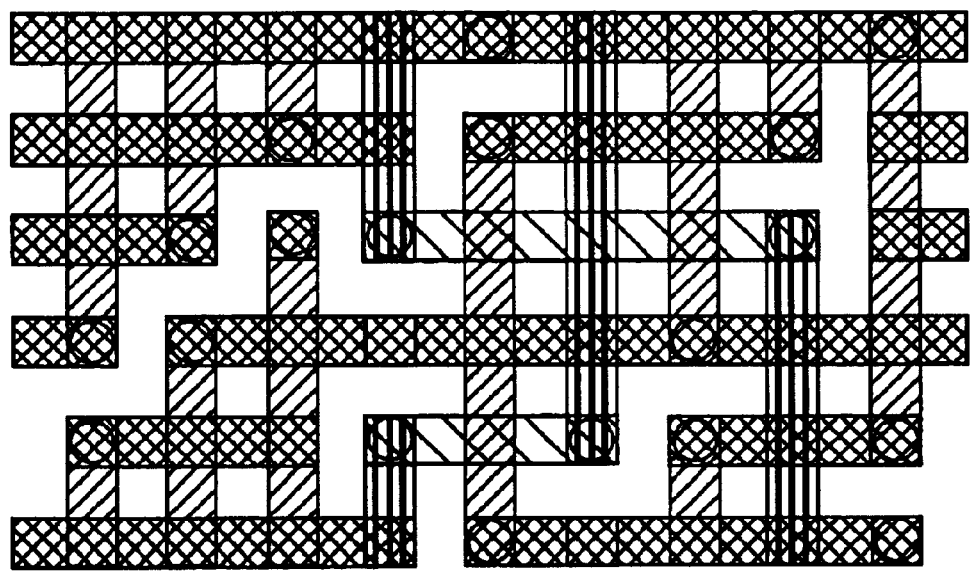

FIG. 18 shows the routing metals and vias after the extraneous vias without the covering of appropriate extraneous metal layers have been deleted. Routing connectors are now hiding among a number of filled connectors and they are very difficult to identify in a reverse engineering attack.

As already explained with reference to the first embodiment, extraneous conductive lines and extraneous vias are not optically differentiable from functional conductive lines and functional vias, respectively.

Figure 19:
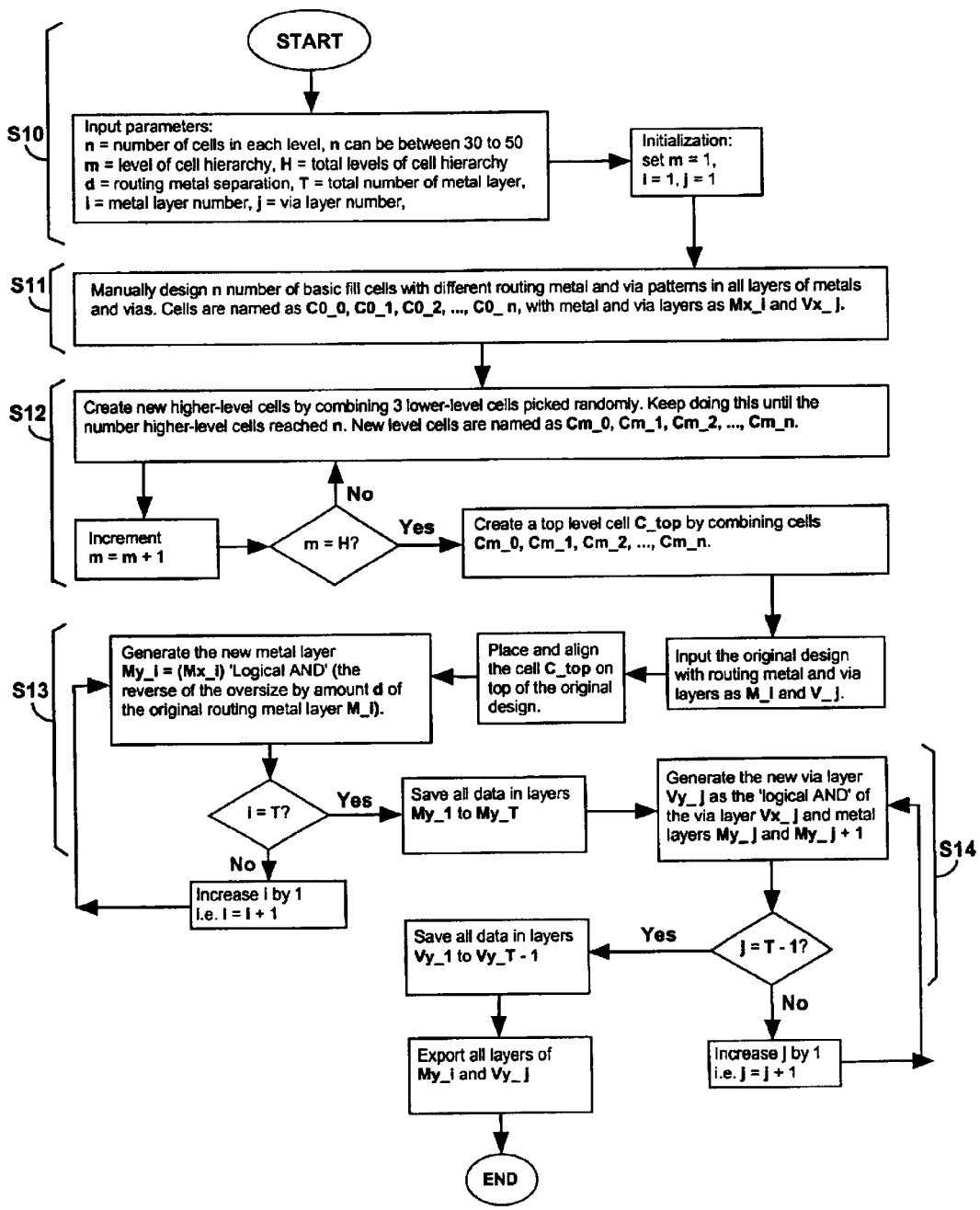
FIG. 19 shows a flow-chart diagram in accordance with the steps of FIGS. 14–18.

FIG. 19 shows a flow-chart diagram detailing the second embodiment, where S10 indicates initialization operations, S11 indicates operations relating to the first step, S12 indicates operations relating to the second step, S13 indicates operations relating to the third step, and S14 indicates operations relating to the fourth step.

Once a layout like the one shown in FIG. 12 or 18 has been obtained, a mask is prepared for each layer and then sent to the foundry for the making of the integrated circuit. In the examples shown in the present application, three different masks will have to be prepared, one for the upper layer (functional and extraneous conductive lines), one for the intermediate layer (functional and extraneous via holes), and one for the lower layer (functional and extraneous conductive lines). Mask preparation steps are known as such and will not be described here in detail. Reference can be made, for example, to 'VLSI Technology', edited by S. M. Sze, McGraw-Hill, 1983.

Although the present invention has been described with respect to specific embodiments thereof, various changes and modifications can be carried out by those skilled in the art without departing from the scope of the invention. It is intended, therefore, that the present invention encompass changes and modifications falling within the scope of the appended claims.

What is claimed is:

1. A multilayered integrated circuit comprising:
   an upper conductive layer having upper conductive lines for carrying electrical signals among components of the integrated circuit;
   a lower conductive layer having lower conductive lines for carrying electrical signals among components of the integrated circuit; and
   an intermediate layer having conductive via holes electrically connecting the upper conductive lines with the lower conductive lines, wherein
   at least one line among either the upper conductive lines or the lower conductive lines is an extraneous conductive line;
   at least one via hole among the conductive via holes is an extraneous via hole;
   the at least one extraneous conductive line is made of a material which is the same as the material of the upper and lower conductive lines; and
   the at least one extraneous conductive line and extraneous via hole form an extraneous path, not connected to the operational functionality of the circuit, in order to confuse a reverse engineer.

2. The multilayered integrated circuit of claim 1, wherein the at least one extraneous conductive line has dimensions which are the same as the dimensions of the upper and lower conductive lines.

3. The multilayered integrated circuit of claim 1, further comprising:
   upper routing channels in which the upper conductive lines are placed; and
   lower routing channels in which the lower conductive lines are placed,
   wherein the at least one extraneous conductive line is placed in at least one of the routing channels.

4. The multilayered integrated circuit of claim 1, wherein both the upper conductive lines and the lower conductive lines comprise extraneous conductive lines.

5. The multilayered integrated circuit of claim 1, the integrated circuit being a CMOS integrated circuit.

6. The multilayered integrated circuit of claim 1, the integrated circuit being a bipolar integrated circuit.

7. The multilayered integrated circuit of claim 1, the integrated circuit being made of a III–V material.

8. The multilayered integrated circuit of claim 1, wherein the at least one extraneous conductive line is a plurality of extraneous conductive lines.

9. The multilayered integrated circuit of claim 8, wherein the plurality of extraneous conductive lines comprise extraneous conductive lines connected to a ground voltage.

10. The multilayered integrated circuit of claim 8, wherein the plurality of extraneous conductive lines comprise extraneous conductive lines connected to a power supply voltage.

11. The multilayered integrated circuit of claim 8, wherein the plurality of extraneous conductive lines comprise extraneous conductive lines connected to a clocked voltage.

12. The multilayered integrated circuit of claim 1, further comprising additional conductive layers and additional intermediate layers between the additional conductive layers.

13. The multilayered integrated circuit of claim 1, wherein the extraneous path is formed to carry a specious signal, unnecessary to the operation of the integrated circuit.

14. A process of making a multilayered integrated circuit comprising the steps of:
   forming an upper conductive layer having upper conductive lines for carrying electrical signals among components of the integrated circuit;
   forming a lower conductive layer having lower conductive lines for carrying electrical signals among components of the integrated circuit;
   forming an intermediate layer having via holes electrically connecting the upper conductive lines with the lower conductive lines;
   forming extraneous conductive lines in at least one conductive layer among the upper conductive layer and lower conductive layer, the extraneous conductive lines being made of a material which is the same of the material of the upper and lower conductive lines;
   forming extraneous via holes among the via holes;
   the extraneous conductive lines and extraneous via holes forming extraneous paths, not connected to the operational functionality of the circuit, in order to confuse a reverse engineer.

15. The process of claim 14, wherein the extraneous conductive lines have dimensions which are the same as the dimensions of the upper and lower conductive lines.

16. The process of claim 14, further comprising the steps of:
   forming upper routing channels in which the upper conductive lines are placed;
   forming lower routing channels in which the lower conductive lines are placed; and
   placing the extraneous conductive lines in at least one of the routing channels.

17. The process of claim 14, wherein the extraneous conductive lines are formed both in the upper conductive layer and lower conductive layer.

18. The process of claim 14, wherein the integrated circuit is a CMOS integrated circuit.

19. The process of claim 14, wherein the integrated circuit is a bipolar integrated circuit.

20. The process of claim 14, wherein the integrated circuit is a circuit made of a III–V material.

21. The process of claim 14, wherein the extraneous conductive lines comprise extraneous conductive lines connected to a ground voltage.

22. The process of claim 14, wherein the extraneous conductive lines comprise extraneous conductive lines connected to a power supply voltage.

23. The process of claim 14, wherein the extraneous conductive lines comprise extraneous conductive lines connected to a clocked voltage.

24. The process of claim 14, wherein the extraneous paths carry specious signals, unnecessary to the operation of the integrated circuit.

25. A method of designing a multilayered electronic circuit comprising functional conductive lines for transmission of electric signals and extraneous conductive lines, the designed multilayered circuit being suitable for making a corresponding three-dimensional multilayered electronic circuit, the method comprising:
   providing a representation of a first conductive layer having first layer functional conductive lines for carrying electrical signals among components of the electronic circuit;
   providing a representation of a second conductive layer having second layer functional conductive lines for carrying electrical signals among components of the electronic circuit;
   providing a representation of functional via holes electrically connecting the first layer conductive lines with the second layer conductive lines; and
   providing a representation of extraneous conductive lines to be inserted in at least one layer among the first conductive layer and the second conductive layer;
   providing a representation of extraneous via holes electrically connecting the extraneous conductive lines, the extraneous conductive lines and extraneous via holes being designed to form an extraneous path, not connected to the operational functionality of the circuit, to confuse a reverse engineer.

26. The method of claim 25, further comprising providing a representation of inserting the extraneous conductive lines in the first conductive layer and in the second conductive layer.

27. The method of claim 26, further comprising providing a representation of cutting the extraneous conductive lines.

28. The method of claim 27, wherein the extraneous conductive lines are cut according to multiple generations of random numbers.

29. The method of claim 27, further comprising providing a representation of extraneous connection vias connecting extraneous conductive lines in the first layer to extraneous conductive lines in the second layer.

30. The method of claim 29, wherein each extraneous conductive line has a first end and a second end, the method further comprising a computer generated representation of deleting extraneous connecting vias not located at the first end or the second end of an extraneous conductive line.

31. The method of claim 27, wherein each extraneous conductive line has a first end and a second end, the method further comprising providing a representation of extraneous connection vias, located either at the first or at the second end of extraneous conductive lines.

32. The method of claim 31, further comprising providing a representation of extraneous connecting vias, located between the first and the second end of extraneous conductive lines.

33. The method of claim 25, further providing a representation of basic fill cells, each basic fill cell comprising at least one extraneous conductive line or at least one connecting via.

34. The method of claim 33, further providing a representation of combining the basic fill cells to form larger cells.

35. The method of claim 34, further comprising a representation of deleting portions of extraneous conductive lines, which portions are overlapping with the functional conductive lines.

36. The method of claim 35, wherein the extraneous connecting vias have a first connecting end and a second connecting end, the method further comprising a representation of deleting extraneous connecting vias not connected to conductive lines at both the first connecting end and the second connecting end.

37. The method of claim 36, further comprising a representation of deleting portions of extraneous conductive lines, which portions are close to the functional conductive lines.

38. The method of claim 37, wherein the extraneous connecting vias have a first connecting end and a second connecting end, the method further comprising a representation of deleting extraneous connecting vias not connected to conductive lines at both the first connecting end and the second connecting end.

39. The method of claim 25, wherein each representation is a computer generated representation.

40. The method of claim 25, wherein the extraneous path is designed to carry a specious signal, unnecessary to the operation of the electronic circuit.

41. A process of making an electronic circuit comprising the steps of:
   providing functional conductive lines for carrying electrical signals among components of the electronic circuit;
   providing functional via holes for electrical connection of the functional conductive lines;
   providing extraneous conductive lines, the extraneous conductive lines performing functions which are unnecessary to the operation of the electronic circuit; and
   providing extraneous via holes for electrical connection of the extraneous conductive lines, the extraneous conductive lines and extraneous via holes forming an extraneous path, not connected to the operational functionality of the circuit, in order to confuse a reverse engineer.

42. The process of claim 41, wherein each extraneous conductive line has a first end and a second end, and wherein, in the step of providing extraneous via holes, the extraneous via holes are provided either at the first end or the second end of extraneous conductive lines.

43. The process of claim 41, wherein the extraneous conductive lines and the extraneous via holes are combined to form basic fill cells.

44. The process of claim 43, wherein the basic fill cells are combined to form larger cells.

45. The process of claim 41, further comprising the step of deleting portions of the extraneous conductive lines overlapping with the functional conductive lines.

46. The process of claim 41, wherein the extraneous via holes have a first connecting end and a second connecting end, the process further comprising the step of eliminating extraneous via holes not connected to conductive lines at both the first connecting end and the second connecting end.

47. The process of claim 41, further comprising the step of eliminating portions of extraneous conductive lines, to maintain a predetermined minimum distance between extraneous conductive lines and functional conductive lines.

48. The process of claim 41, wherein the extraneous path carries a specious signal, unnecessary to the operation of the electronic circuit.

* * * * *